(12) United States Patent
Ren et al.

(10) Patent No.: US 10,685,849 B1
(45) Date of Patent: Jun. 16, 2020

(54) DAMAGE FREE METAL CONDUCTOR FORMATION

(71) Applicant: Applied Materials, Inc., Santa Clara, CA (US)

(72) Inventors: He Ren, San Jose, CA (US); Jong Mun Kim, San Jose, CA (US); Maximillian Clemons, Sunnyvale, CA (US); Minrui Yu, San Jose, CA (US); Mehul Naik, San Jose, CA (US); Chentsau Ying, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/400,737

(22) Filed: May 1, 2019

(51) Int. Cl.
*H01L 21/321* (2006.01)
*H01L 21/3213* (2006.01)

(52) U.S. Cl.
CPC .. *H01L 21/32137* (2013.01); *H01L 21/32139* (2013.01)

(58) Field of Classification Search
CPC .................... H01L 21/32137; H01L 21/32139
See application file for complete search history.

(56) References Cited

U.S. PATENT DOCUMENTS

2014/0127906 A1\* 5/2014 Cabral, Jr. ........ H01L 21/32131
438/694

\* cited by examiner

*Primary Examiner* — Roberts P Culbert
(74) *Attorney, Agent, or Firm* — Kilpatrick Townsend & Stockton LLP

(57) ABSTRACT

Exemplary methods of etching semiconductor substrates may include flowing a halogen-containing precursor into a processing region of a semiconductor processing chamber. The processing region may house a substrate having a conductive material and an overlying mask material. The conductive material may be characterized by a first surface in contact with the mask material, and the mask material may define an edge region of the conductive material. The methods may include contacting the edge region of the conductive material with the halogen-containing precursor and the oxygen-containing precursor. The methods may include etching in a first etching operation the edge region of the conductive material to a partial depth through the conductive material to produce a footing of conductive material protruding along the edge region of the conductive material. The methods may also include removing the footing of conductive material in a second etching operation.

20 Claims, 5 Drawing Sheets

DAMAGE FREE METAL CONDUCTOR FORMATION

TECHNICAL FIELD

The present technology relates to semiconductor processes and equipment. More specifically, the present technology relates to etching conductive materials.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary methods of etching semiconductor substrates may include flowing a halogen-containing precursor into a processing region of a semiconductor processing chamber. The processing region may house a substrate having a conductive material and an overlying mask material. The conductive material may be characterized by a first surface in contact with the mask material, and the mask material may define an edge region of the conductive material. The methods may include flowing an oxygen-containing precursor into the processing region of the semiconductor processing chamber. The methods may include contacting the edge region of the conductive material with the halogen-containing precursor and the oxygen-containing precursor. The methods may include etching in a first etching operation the edge region of the conductive material to a partial depth through the conductive material to produce a footing of conductive material protruding along the edge region of the conductive material. The methods may also include removing the footing of conductive material in a second etching operation.

In some embodiments the second etching operation may include contacting the footing of conductive material with ions configured to sputter the footing from the conductive material. The first etching operation may occur in a first direction through a thickness of the conductive material, and the second etching operation may deliver ions in a direction substantially normal to the first direction. The second etching operation may be performed at an ionic source power below or about 5 kW. The semiconductor processing chamber may be a first chamber, and the second etching operation may be performed in a second chamber different from the first chamber. The first chamber and the second chamber may be coupled with a single processing system. The method may also include transferring the substrate from the first chamber to the second chamber. The substrate may be maintained under vacuum conditions during the transferring from the first chamber to the second chamber.

The halogen-containing precursor may include at least one of a chlorine-containing precursor and a fluorine-containing precursor. The method may be performed at a chamber temperature less than or about 150° C. The conductive material may include one or more elements selected from the group including titanium, platinum, nickel, tantalum, molybdenum, silicon, or ruthenium. The conductive material may include more than 90% by volume nickel monosilicide.

Some embodiments of the present technology may also encompass methods of etching a semiconductor substrate. The methods may include flowing an etchant precursor into a processing region of a semiconductor processing chamber. The processing region may house a substrate having a conductive material and an overlying mask material. The conductive material may be characterized by a first surface in contact with the mask material, and the mask material may define an edge region of the conductive material. The methods may include contacting the edge region of the conductive material with the etchant precursor. The methods may include etching in a first etching operation the edge region of the conductive material to a partial depth. The conductive material may be at least partially maintained during the first etching operation. The methods may also include sputtering the conductive material that is at least partially maintained in a second etching operation.

In some embodiments, the etchant precursor may be or include a halogen-containing precursor and an oxygen-containing precursor. At least one of the halogen-containing precursor or the oxygen-containing precursor may be plasma enhanced during the first etching operation. The halogen-containing precursor may be or include a combination of a chlorine-containing precursor and a fluorine-containing precursor. The conductive material may be or include a silicide of titanium, nickel, platinum, tantalum, tungsten, cobalt, or molybdenum. The mask material may be or include a transition-metal nitride. The first etching operation may occur in a first direction through a thickness of the conductive material. The second etching operation may deliver ions in a direction substantially normal to the first direction.

Some embodiments of the present technology may also encompass methods of etching a semiconductor substrate. The methods may include flowing an etchant precursor into a processing region of a first semiconductor processing chamber. The processing region may house a substrate having a conductive material. The methods may include contacting an edge region of the conductive material with the etchant precursor. The methods may include etching in a first etching operation the edge region of the conductive material to a partial depth. The conductive material may be at least partially maintained during the first etching operation. The methods may include transferring the substrate from the first semiconductor processing chamber to a second semiconductor processing chamber while maintaining vacuum conditions. The methods may also include sputtering the conductive material that is at least partially maintained in a second etching operation in the second semiconductor processing chamber. In some embodiments, the first etching operation may occur in a first direction through a thickness of the conductive material. The second etching operation may deliver ions in a direction substantially normal to the first direction.

Such technology may provide numerous benefits over conventional systems and techniques. For example, the processes may provide conductive materials characterized by improved electrical characteristics. Additionally, the methods may limit damage to conductive structures. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
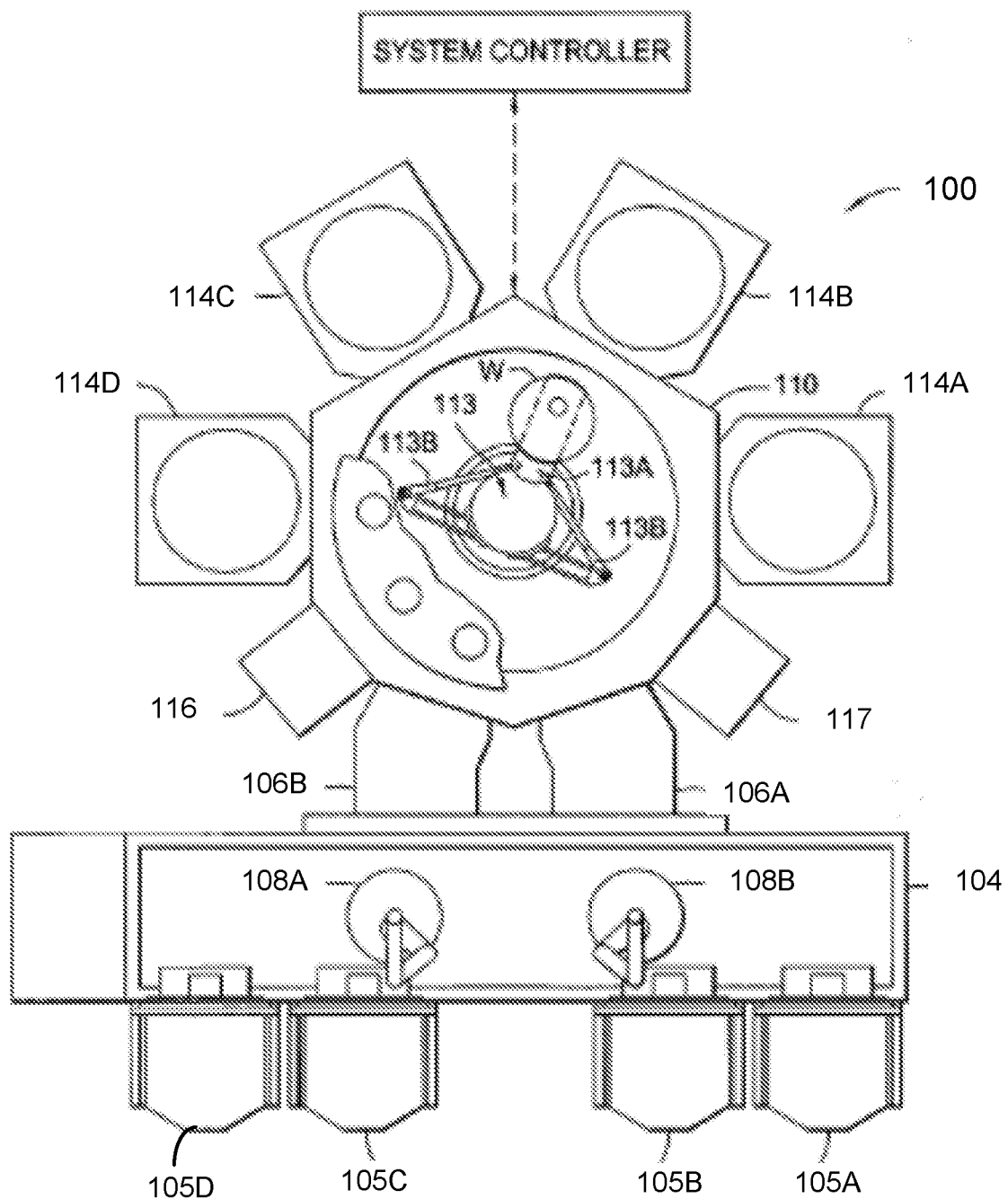
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As electronic devices continue to shrink in size, transitioning to future technology nodes has uncovered challenges with scaling semiconductor materials. For example, copper has been used as an interconnect or wiring material based on the relatively low resistivity of the metal. However, as critical dimensions continue to reduce, copper has been shown to exhibit increasing resistivity. For relatively larger line widths, copper can maintain lower resistivity to maintain device performance. Although, as wiring reduces below 50 nm, the resistivity of copper can increase dramatically due to scattering. Scattering can relate to electrons moving with a flow of current. When electrons reach sidewalls, the electrons may lose momentum in a sense, and the effective resistance begins to increase. At lower line widths, the electron mean free path reduces and scattering increases, and for copper the resistivity can increase more than five times beyond standard bulk resistivity.

Because copper is characterized by low resistivity, the material may still outperform other materials at larger line widths. When transitioning to smaller line widths, the dramatic increase in copper resistivity may cause other materials to begin to outperform copper. For example, metal silicides may be characterized by greater resistivity than copper at larger line widths. However, these materials may be characterized by less dramatic increases in resistivity during device scaling, which may become less than copper at particular line widths. As one non-limiting example, nickel silicide is characterized by a bulk resistivity greater than copper.

However, as critical dimension or trench area reduces, nickel silicide resistivity increases much more slowly than copper, and can begin to outperform copper at trench widths below about 500 nm$^2$.

However, due to the multi-element nature of metal silicides, formation and etching may be more difficult than with copper. For example, again with the non-limiting example of nickel silicide, nickel silicide may be characterized by a number of phases or structural combinations of the elements, with nickel monosilicide (NiSi) providing superior electrical function over other silicides of nickel. This same situation may occur with many other silicides or material alloys that can be used in conductor formation, and the description similarly encompasses those materials. Forming layers of nickel monosilicide may include a number of challenges related to maintaining the 1:1 stoichiometric relationship of the elements. Additionally, etching nickel monosilicide may cause further degradation of the material due to oxidation of the film.

For example, nickel monosilicide is often formed with a capping layer, such as a nitride, which may facilitate passivation of the silicide, and may be removed in subsequent operations. To remove the layer, conventional technology may use an oxidant such as Piranha solution. After removal of the capping layer, further etching of the conductor material can be performed. However, this process exposes a top of the silicide film to the Piranha solution, which can cause increased damage to the film. For example, the oxidation reaction may form an amount of silicon oxide from the nickel silicide, which may shift the stoichiometric relationship from 1:1 to a more nickel-rich ratio of 2:1 or more for the remaining material, which may increase the resistivity of the volume of material, and overcome the previous benefits of using the material. Conventional technologies have therefore been limited in the ability to maintain proper stoichiometry during etching reactions, even when initially formed films may exhibit a 1:1 relationship of the metal and silicide.

Similarly, dry etches using an oxidizer can cause a similar sidewall damage when film trimming may be performed. The present technology overcomes these issues by performing a two-part etch. Unlike conventional technology, in some embodiments of the present technology the etch process may be performed while maintaining the nitride capping layer over an otherwise exposed surface of the conductive material. This may protect a surface in contact with the capping layer from being oxidized. The two part sidewall etch may include a first etch process in which an oxidant is used in a controlled delivery to provide a partial etch through a depth of the conductor film. Subsequently, a second etch that may be free of an oxidizing material may be performed to trim remaining portions of the conductive material. These processes have been shown to maintain a 1:1 stoichiometry of the nickel monosilicide that may be substantially maintained through the remaining volume of conductive material.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes or chambers alone. Moreover, although an exemplary chamber is described to provide foundation for the present technology, it is to be understood that the present technology can be performed in any number of semiconductor processing chambers that may be configured to perform the described operations. Similarly, although a specific material etching will be described, it is to be understood that the processes may be equally applicable to other processes in which material etching may be performed. Accordingly, the examples given should not be considered to limit the scope of the described technology.

FIG. 1 shows a top plan view of one embodiment of a processing system 100 of deposition, etching, baking, and curing chambers according to embodiments. The tool or processing system 100 depicted in FIG. 1 may contain a plurality of process chambers, 114A-D, a transfer chamber 110, a service chamber 116, an integrated metrology chamber 117, and a pair of load lock chambers 106A-B. The process chambers may include structures or components similar to those described in relation to FIG. 2, as well as additional processing chambers.

To transport substrates among the chambers, the transfer chamber 110 may contain a robotic transport mechanism 113. The transport mechanism 113 may have a pair of substrate transport blades 113A attached to the distal ends of extendible arms 113B, respectively. The blades 113A may be used for carrying individual substrates to and from the process chambers. In operation, one of the substrate transport blades such as blade 113A of the transport mechanism 113 may retrieve a substrate W from one of the load lock chambers such as chambers 106A-B and carry substrate W to a first stage of processing, for example, an etching process as described below in chambers 114A-D. The chambers may be included to perform individual or combined operations of the described technology. For example, while one or more chambers may be configured to perform a deposition or formation operation, one or more other chambers may be configured to perform the first etching operation and/or the second etching operation described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 113A and may insert a new substrate with a second blade (not shown). Once the substrate is processed, it may then be moved to a second stage of processing. For each move, the transport mechanism 113 generally may have one blade carrying a substrate and one blade empty to execute a substrate exchange. The transport mechanism 113 may wait at each chamber until an exchange can be accomplished.

Once processing is complete within the process chambers, the transport mechanism 113 may move the substrate W from the last process chamber and transport the substrate W to a cassette within the load lock chambers 106A-B. From the load lock chambers 106A-B, the substrate may move into a factory interface 104. The factory interface 104 generally may operate to transfer substrates between pod loaders 105A-D in an atmospheric pressure clean environment and the load lock chambers 106A-B. The clean environment in factory interface 104 may be generally provided through air filtration processes, such as HEPA filtration, for example. Factory interface 104 may also include a substrate orienter/aligner (not shown) that may be used to properly align the substrates prior to processing. At least one substrate robot, such as robots 108A-B, may be positioned in factory interface 104 to transport substrates between various positions/locations within factory interface 104 and to other locations in communication therewith. Robots 108A-B may be configured to travel along a track system within factory interface 104 from a first end to a second end of the factory interface 104.

The processing system 100 may further include an integrated metrology chamber 117 to provide control signals, which may provide adaptive control over any of the processes being performed in the processing chambers. The integrated metrology chamber 117 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Figure 2:
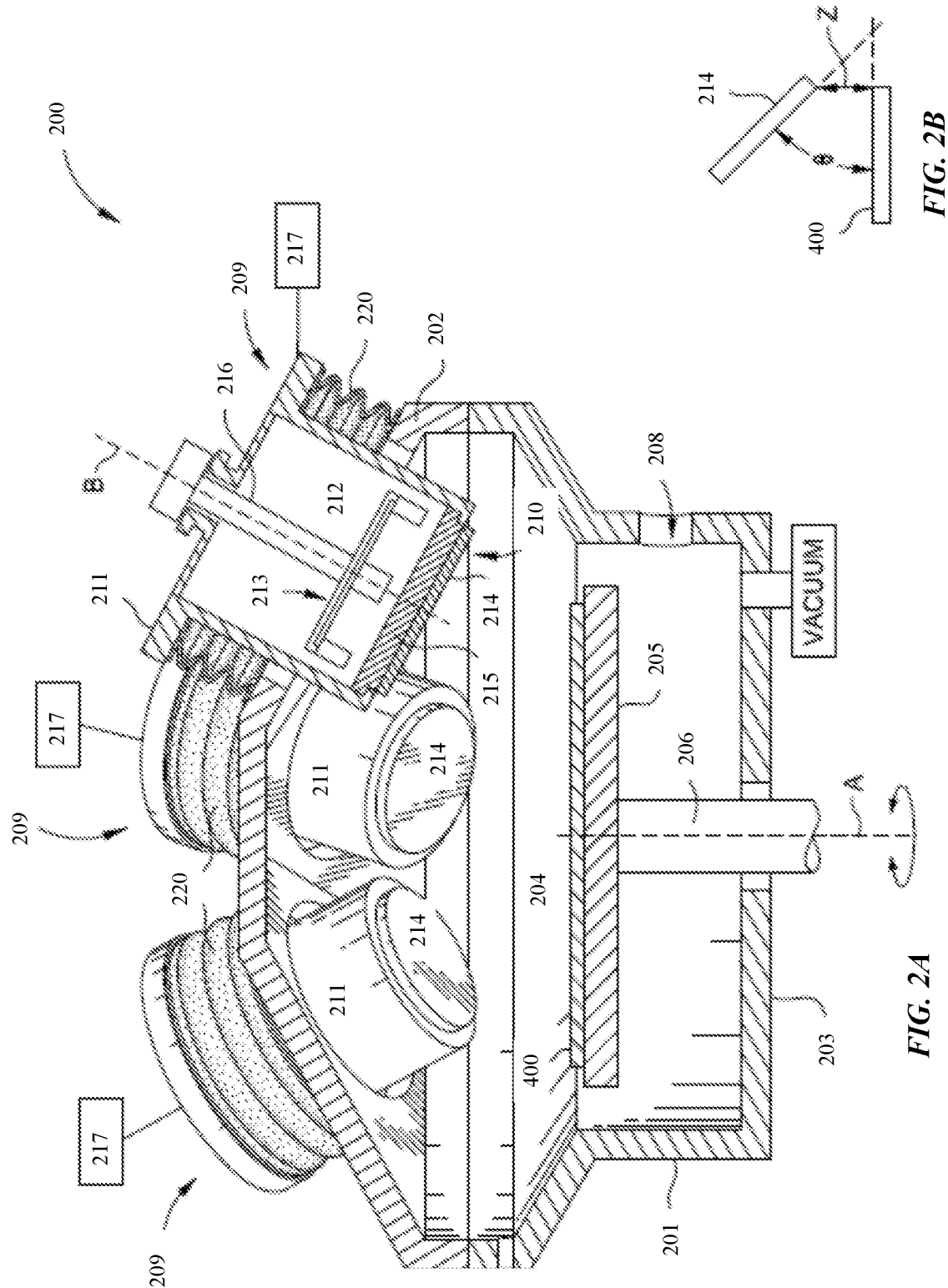
FIG. 2A shows a schematic cross-sectional view of an exemplary processing chamber according to some embodiments of the present technology.
FIG. 2B illustrates the relative positions of a target and a substrate disposed in the chamber of FIG. 1A during substrate processing, according to some embodiments of the present technology.

Turning now to FIG. 2 is shown a schematic cross-sectional view of an exemplary multi-cathode physical vapor deposition chamber 200 which may be used to form one or more of the films to be etched according to embodiments of the present technology. The chamber 200 features one or more sidewalls 201, a chamber lid 202, and a chamber base 203, which together may define a processing volume 204. The processing volume 204 may be fluidly coupled with a vacuum, such as to one or more dedicated vacuum pumps, which may maintain the processing volume 204 at sub-atmospheric conditions and evacuate processing and other gases during processing.

A substrate support 205, disposed in the processing volume 204, may be disposed on a movable support shaft 206 sealingly extending through the chamber base 203, such as while surrounded by a bellows in the region below the chamber base 203. Chamber 200 may transfer a device 400 to and from the substrate support 205 through an opening 208 in one of the one or more sidewalls 201, which may be sealed with a door or a valve during substrate processing. In some embodiments, the support shaft 206 may be further coupled with an actuator configured to rotate the support shaft 206, and thus the device 400 disposed on the substrate support 205, about an axis A during substrate processing. Under some process conditions, this rotation may improve the thickness and/or coverage uniformity of the deposited layers on the surface of the device 400.

Chamber 200 may also features a plurality of cathodes 209. One or more of the cathodes 209 may include a target assembly 210 disposed in the processing volume 204, a cathode housing 211 coupled with the target assembly 210 where the cathode housing 211 and the target assembly may define a housing volume 212, and a magnet assembly 213 disposed in the housing volume 212. In some embodiments, the target assembly 210 may include a sputtering target 214 disposed on, and bonded with, a target backing plate 215. In other embodiments, the target assembly 210 may include a unitary body formed of a target material to be sputtered. In some embodiments, the magnet assembly 213 may be coupled with a rotatable shaft 216 that may be configured to rotate the magnet assembly 213 about an axis B over the rear, non-sputtering side of the target assembly 210. Each of the cathodes 209 may be coupled with a power supply 217, such as to an RF frequency power supply, a DC power supply, or a pulsed DC power supply. In some embodiments, a cooling fluid having a relatively high resistivity may be provided to the housing volume 212 by a cooling fluid source in fluid communication with the housing to cool the magnet assembly 213 and the adjacent target assembly 210.

The chamber 200 may also include a shield assembly disposed within the processing volume 204, and which may extend between adjacent target assemblies 210. The shield may be configured or positioned to limit or prevent cross-talk or electrical interference between a first cathode power supply and a second cathode power supply during a co-sputtering process. The shield may also limit or prevent cross-target contamination or undesirable deposition of material from the target of a first cathode onto the target of another cathode during co-sputtering, sequential sputtering, or single sputtering processes.

Each of the cathodes 209 may include a bellows 220 and an angular adjustment mechanism that may be coupled with the exterior of the chamber lid 202 and to the cathode housing 211. The bellows 220 may be used to maintain the vacuum condition of the processing volume 204 by preventing the passage of atmospheric gases into the processing volume 204 and leakage of processing gases from the processing volume 204 to the surrounding environment. The bellows may prevent this passage of gases, while allowing angular adjustment of the cathode housing 211 with respect to the chamber body. The angular adjustment mechanism may be used to alter, and then fix, the position the cathode housing 211, and thus a sputtering surface of a target 214 coupled thereto, at an angle relative to the surface of the device 400.

FIG. 2B illustrates the relative positions of a target 214 of any one of the cathodes 209 and a device 400 when the device 400 is in a raised substrate processing position, according to one embodiment. The target 214 may be spaced apart from a plane of a surface of the device 400 by a vertical distance Z measured from a portion of the target 214 closest to the plane of the surface of the substrate. The vertical distance Z may be between about 100 mm and about 400 mm, between about 150 mm and about 250 mm, between about 200 mm and about 300 mm, or between about 225 mm and about 275 mm. The sputtering surface of the target 214 may be angled with respect to the surface of the device 400 at an angle θ between about 10 degrees and about 50 degrees, between about 20 degrees and about 40 degrees, between about 20 degrees and about 30 degrees, or between about 30 degrees and about 40 degrees.

Device 400 may be characterized by a diameter of 300 mm or more and the target 214 may be characterized by a diameter less than the diameter of the device 400, such as less than 300 mm. The target 214 may be characterized by a diameter that is less than or about 200 mm, less than or about 150 mm, between about 50 mm and about 200 mm, between about 50 mm and about 150 mm, or about 100 mm. In some embodiments, a thickness of the target, for example a thickness of a metal-silicon alloy forming the target, may be between about 2 mm and about 5 mm.

Figure 3:
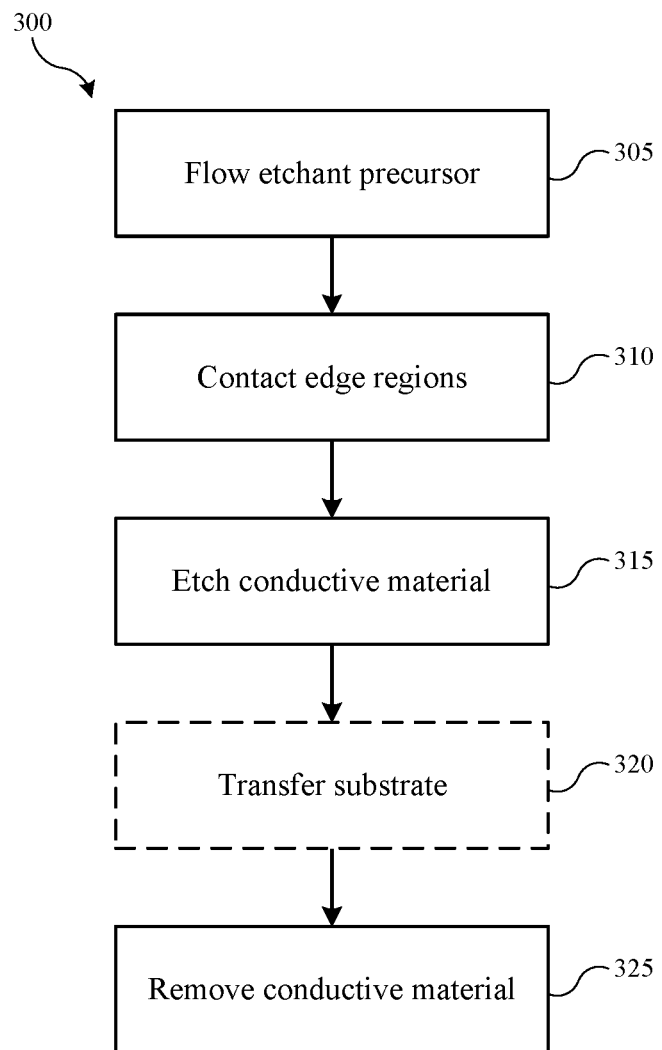
FIG. 3 shows selected operations in an etching method according to some embodiments of the present technology.
Figure 4A:
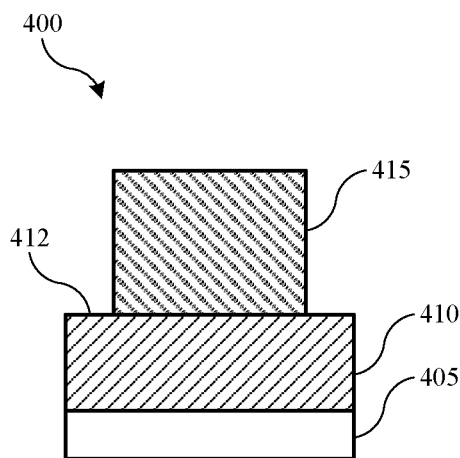
FIGS. 4A-4C illustrate cross-sectional views of substrate materials on which selected operations are being performed according to some embodiments of the present technology.
Figure 4B:
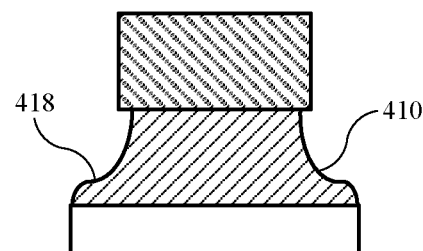
Figure 4C:
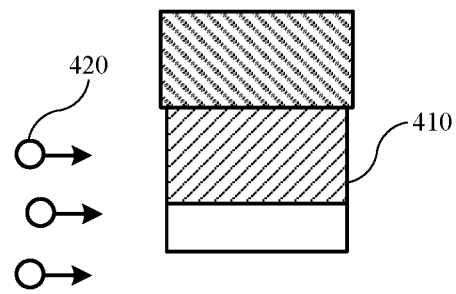

FIG. 3 illustrates a method 300 of forming a semiconductor structure, operations of which may be performed, for example, in chamber 200 as well as in a number of chambers incorporated on multi-chamber processing system 100 as previously described. Method 300 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the structural formation process, but are not critical to the technology, or may be performed by alternative methodology as will be discussed further below. Method 300 describes the operations shown schematically in FIGS. 4A-4C, the illustrations of which will be described in conjunction with the operations of method 300. It is to be understood that FIG. 4 illustrates only partial schematic views, and a substrate may contain any number of transistor sections and additional materials having aspects as illustrated in the figures.

Method 300 may involve optional operations to develop the semiconductor structure to a particular fabrication operation. Although in some embodiments method 300 may be performed on a base structure, in some embodiments the method may be performed subsequent other material formation, such as a metal-containing film formed in chamber 200 described above. As illustrated in FIG. 4A, the semiconductor structure may represent a device 400 after certain processing has been completed. For example, substrate 405 may be a planar material, or may be a structured device, which may include one or more materials configured as or defining posts, trenches, or other structures as would be understood are similarly encompassed by the present technology. Substrate 405 may include any number of materials including silicon or silicon-containing materials such as oxides, nitrides, and carbides of silicon, as well as any other materials that may be incorporated within a structure.

One or more material layers may be formed over some or all of substrate 405, as well as formed at least partially within the substrate, to produce a structure that may be a planarized or structured material in embodiments. As one non-limiting example, over or within substrate 405 may be a metal-containing material or conductive material 410 that may have been deposited in chamber 200. Conductive material 410 may include any conductive material, and in some embodiments may be silicide or alloy material formed overlying or extending within or through substrate 405. The conductive material may include any number of elements including one or more transition metals or other conductive metals. For example, and as non-limiting examples, conductive material 410 may include a silicide including one or more of titanium, nickel, platinum, tantalum, ruthenium, tungsten, cobalt, molybdenum, or other materials capable of forming conductive silicides. Additionally, conductive material 410 may include one or more alloyed materials including any of the noted metals or other metals that may be alloyed with any of the noted metals. As previously discussed, conductive material 410 may be formed to exhibit a particular stoichiometry for any of the materials used. The remaining discussion will be based on a non-limiting example of conductive material 410 being nickel silicide, although it is to be understood that the conductive material 410 may be any of these other materials, which are similarly encompassed by the present technology.

An additional material layer may be formed overlying the conductive material 410, which may be or include a mask material 415. As described previously, mask material 415 may be a specific hardmask material or a residual material from previous operations. For example, after forming conductive material 410, a second formation may be performed in chamber 200 or some other chamber to produce overlying mask material 415. The material may initially be formed to passivate the film as discussed previously, and the material may be intended to be removed. However, unlike in conventional operations, material 415 may be removed subsequent etching of conductive material 410 in some embodiments of the present technology. Mask material 415 may be a transition-metal nitride, such as titanium nitride, tantalum nitride, or any other nitride material or dielectric material that may be formed over the conductive material, and may facilitate subsequent operations, such as high-pressure formation operations configured to produce a particular stoichiometry of the conductive material 410.

As discussed above, conductive material 410 may be a material characterizable by a number of stoichiometries or phases. Continuing the non-limiting example, nickel silicide may include many forms, several of which may exhibit reduced electrical properties. Nickel monosilicide (NiSi) may exhibit superior resistivity at line dimensions below or about 50 nm, such as relative to copper, and may be formed as the conductive material 410. Maintaining a 1:1 stoichiometry of the materials may be compromised during etching operations, and thus the present technology may etch the conductive material 410 while maintaining or substantially maintaining the stoichiometry produced during formation.

Subsequent formation of conductive material 410 and mask material 415, substrate 405 may be transferred to a semiconductor processing chamber for a first etching operation. As previously discussed, mask material 415 may be a material formed during or directly subsequent formation of the nickel silicide, and which may be maintained over the conductive material during the present etching operations. This may differ from other processes in which the mask material 415 may be removed with an oxidizing etchant prior to etching of the conductive material 410. Accordingly, the present technology may perform etching of conductive material 410 while mask material 415 is at least partially maintained over the conductive material.

The mask material 415 may be partially etched in some embodiments or may at least partially define regions of the conductive material 410. For example, in some embodiments mask material 415 may define or expose an edge region 412 of the conductive material, which may be intended for removal during etching operations according to embodiments of the present technology. Through particular formation, or through controlled removal, mask material 415 may provide an amount of coverage for a top surface of conductive material 410, while providing access to a side region of the conductive material. By side region may be meant any portion of conductive material 410 extending inward a specific distance from one or more lateral or exterior edges of conductive material 410. For example, as illustrated in FIG. 4A, mask material 415 may overlie a central region of conductive material 410 and contact a first surface of the conductive material. The mask material may expose or provide access to exterior portions of the conductive material 410, which may be or encompass the side region. Because etching operations may produce an amount of undercut to the mask material, providing access to the conductive material may include an understood undercut area that may be etched during the operations described below, and which may constitute a portion of the side region as well.

Transferring of the substrate may involve transfer within a processing system incorporating multiple chambers. This may allow transfer while maintaining vacuum conditions, which may limit air or other oxygen exposure of the conductive material 410. The first processing chamber may be an etching chamber, and the substrate may be positioned in a processing region of the chamber. The etching chamber may be configured to perform any of a number of types of etching, and in some embodiments may be configured to perform plasma etching, including reactive ion etching. A halogen-containing precursor may be delivered into the processing region of the chamber. An oxygen-containing precursor may also be delivered into the processing region of the chamber, and the delivery may be concurrent with delivery of the halogen-containing precursor in some embodiments. The precursors may be constituents of an etchant precursor or precursors delivered into the processing region during method 300 at operation 305.

In some embodiments, one or more including all of the etchant precursors may be plasma enhanced within the first processing chamber. The precursors may be flowed together or sequentially as well. Any type of plasma enhancement may occur, which may be locally formed or remotely formed in embodiments. The etchant precursors may then be flowed to contact the edge regions of the conductive material to be removed in operation 310. A first etching operation may be performed at operation 315, which may etch a portion of the edge region of the conductive material. The etching may be performed to partially etch through the conductive material 410 in a direction towards the substrate 405 from the mask material 415. In some embodiments, the first etching operation may not fully etch through the depth of the side region of the conductive material. As shown in FIG. 4B, the first etching operation may extend partially through the depth of the conductive material 410, while not completely etching through the side regions of the conductive material.

When an oxidant dry etch is performed to fully remove the side regions of conductive material, degradation of the conductive material may occur. As described above, as the exposure to an oxidizer increases, the stoichiometry of the nickel silicide or other material film may shift to a more nickel-rich stoichiometry, which may decrease the electrical performance of the film. However, when a partial etch is performed, the amount of exposure to an oxygen-containing precursor can be limited and the stoichiometry of the remaining film can be maintained. The oxidizing etchants can be used to define a residual portion of the conductive material to be removed, which may include footing 418 as the remaining portion on the edge region of conductive material 410. Footing 418 may be a result of the partial etch performed in the first etching operation. The partial etch of the first etching operation may remove up to, greater than, or about 10% of the depth of the conductive material at the side region, and in embodiments the first etching operation may remove greater than or about 20% of the conductive material, greater than or about 30% of the conductive material, greater than or about 40% of the conductive material, greater than or about 50% of the conductive material, greater than or about 60% of the conductive material, greater than or about 70% of the conductive material, greater than or about 80% of the conductive material, greater than or about 90% of the conductive material, or more, although the first etching operation may remove less than 100% of the side regions. The remaining depth of the side region after the first etching operation may constitute footing 418.

Subsequent the first etching operation, the substrate may be transferred to a second processing chamber at optional operation 320. In some embodiments, a second etching operation may be performed, which may be performed in a different chamber than the first etching operation. When performed in a second processing chamber, the first and second chambers may both be on the same processing system, which again may allow transfer under vacuum conditions. Because further oxidation may degrade the exposed conductive material, the first etching operation and the second etching operation may be performed while maintaining vacuum conditions and limiting or preventing exposure to atmospheric conditions.

A second etching operation may be performed to remove the footing 418, and complete etching of the side region of the conductive material at operation 325. The second etch operation may be performed while limiting or preventing any further oxidizing etchants from contacting the conductive material, and in some embodiments the second etching operation may be an oxygen-free etching operation. The second etching operation may include use of an inert gas that may be used to sputter the footing 418 from the conductive material 410. For example, an ion beam may be generated from one or more inert precursors and used to sputter the footing material 418. The inert precursor may be a noble precursor, such as helium, argon, neon, or xenon in embodiments. Ions may be generated from the precursor and delivered at the footing to finish the etching of the conductive material.

The ion sputtering operation may also be performed to remove only a partial amount of the conductive material at the side region similar to the first etching operation. When ion sputtering may be performed to remove an entire side region, contamination of the conductive material may increase, and degrade the electrical performance of the material. Consequently, a first etching operation may be performed with an etchant including an oxidizing material, and a second etching operation may be performed with an ion sputter. By limiting the extent of exposure of the conductive material to the ion precursor and the oxidizing precursor, degradation of the film may be limited or prevented due to shifting towards a nickel-rich material as well as contamination due to ion bombardment.

The second etching operation may be performed in a direction different from the first etching operation in some embodiments. For example, while the first etching operation may be performed in a direction through the conductive material from the mask material 415 to the substrate 405, the ion sputter may be performed in a second direction normal to the first. As illustrated in FIG. 4C, ions 420 of the inert precursor may be delivered across the substrate to sputter off the footing material. Although the ions 420 are illustrated as extending towards the substrate layers, the ions may actually be extending in a direction into the two-dimensional figure, such as in a z-direction through the image or page relative to the xy-dimensions that may exist for the two dimensional schematic. This may allow the ions to sputter off the footing material while limiting impact contamination on the remaining conductive material. Because the ion beam may be directionally controlled, the direction may be shifted during the second etching operation, and the direction may not be fully normal to the direction of etch in the first etching operation. For example, at any time during the second etching operation, the ion beam may be adjusted to any angle from normal to the direction of etch in the first etching operation to parallel with the direction of etch in the first etching operation.

To control sputtering of the second etching operation, a low-energy ion beam may be used. For example, in some embodiments, the second etching operation may be performed at a source power of less than or about 5,000 W, and may be performed at a source power of less than or about 4,500 W, less than or about 4,000 W, less than or about 3,500 W, less than or about 3,000 W, less than or about 2,500 W, less than or about 2,000 W, less than or about 1,500 W, less than or about 1,000 W, less than or about 500 W, less than or about 250 W, or less.

Precursors used in the first etching operation may include a halogen-containing precursor. The halogen-containing precursor may include one or more halogen precursors during the etching operations. For example, in some embodiments the halogen-containing precursor may include one or more of a fluorine-containing precursor as well as a chlorine-containing precursor as previously described. Continuing the non-limiting example throughout this disclosure, nickel silicide includes two elements, which may include different etching characteristics. Accordingly, by including two halogen-containing precursors in some embodiments, controlled etching of both the nickel and silicon can occur.

An exemplary fluorine-containing precursor may be a carbon-containing fluorine precursor, which may be flowed into the processing region. Other sources of fluorine may be used in conjunction with or as replacements for the precursor. For example, the fluorine-containing precursor may include one or more materials including $NF_3$, HF, $F_2$, $CF_4$, $CHF_3$, $C_2F_6$, $C_3F_6$, $BrF_3$, $C_1F_3$, $SF_6$, or additional fluorine-substituted hydrocarbons, or fluorine-containing materials. The precursor or precursors in the first etching operation may also include any number of carrier gases, which may include nitrogen, helium, argon, or other noble, inert, or useful precursors. The carrier gases may be used to dilute the precursors, which may further reduce etching rates to allow adequate diffusion through the aperture. The chlorine-containing precursors may include diatomic chlorine ($Cl_2$), or may include chlorine-containing compounds. The chlorine-containing compounds may include chlorine forming an ionic or covalent bonding with other elements.

As previously discussed, the first etching operation may include an oxidizing etchant combined with the halogen-containing precursor. In embodiments, any oxygen-containing precursor may be used that may react with the metal-containing or conductive materials. For example, the oxygen-containing precursor may be or include water, diatomic oxygen, ozone, a hydroxyl-containing precursor such as hydrogen peroxide or an alcohol, nitrogen-and-oxygen-containing precursors, plasma-enhanced oxygen including locally or remotely enhanced oxygen, or any other material including oxygen that may be delivered to the processing region to facilitate the first etching operation.

Process conditions may also impact the operations performed in method 300. Each of the operations of method 300 may be performed during a constant temperature in embodiments, while in some embodiments the temperature may be adjusted during different operations. For example, the substrate, pedestal, or chamber temperature during the oxide formation may be maintained at a temperature less than or about 150° C., and in embodiments may be maintained less than or about 140° C., less than or about 130° C., less than or about 120° C., less than or about 110° C., less than or about 100° C., less than or about 90° C., less than or about 80° C., less than or about 70° C., less than or about 60° C., less than or about 50° C., less than or about 40° C., less than or about 30° C., or less. Maintaining the processing chamber or substrate temperatures at lower relative temperatures may facilitate control over the etches being performed.

The pressure within the processing chamber may be controlled during method 300. For example, while performing the etching operations, the pressure within the processing chamber may be maintained below or about 5 Torr. Additionally, in embodiments, the pressure within the processing chamber may be maintained below or about 4 Torr, below or about 3 Torr, below or about 2 Torr, below or about 1 Torr, below or about 500 mTorr, below or about 250 mTorr, below or about 200 mTorr, below or about 150 mTorr, below or about 100 mTorr, below or about 80 mTorr, below or about 60 mTorr, below or about 50 mTorr, below or about 45 mTorr, below or about 40 mTorr, below or about 35 mTorr, below or about 30 mTorr, below or about 25 mTorr, below or about 20 mTorr, below or about 15 mTorr, below or about 10 mTorr, below or about 5 mTorr, or lower, although the pressure may also be included in ranges between any two of these stated numbers or within any smaller range encompassed by any of the stated ranges.

By performing a multi-operational etch according to some embodiments of the present technology, improved control of material stoichiometry may be provided. For example, in the non-limiting example of nickel monosilicide, after the side regions of the conductive material have been removed, the remaining material may be characterized by maintained stoichiometry, where, continuing the same example, greater than or about 80% of the remaining film constitutes nickel monosilicide, and in some embodiments greater than or about 85% of the remaining film may constitute nickel monosilicide, greater than or about 90% of the remaining film may constitute nickel monosilicide, greater than or about 95% of the remaining film may constitute nickel monosilicide, greater than or about 97% of the remaining film may constitute nickel monosilicide, greater than or about 99% of the remaining film may constitute nickel monosilicide, or substantially or essentially the entire film may remain stoichiometrically consistent nickel monosilicide. Accordingly, devices characterized by reduced line widths may provide improved resistivity due to the improved line production according to embodiments of the present technology.

Figure 5:
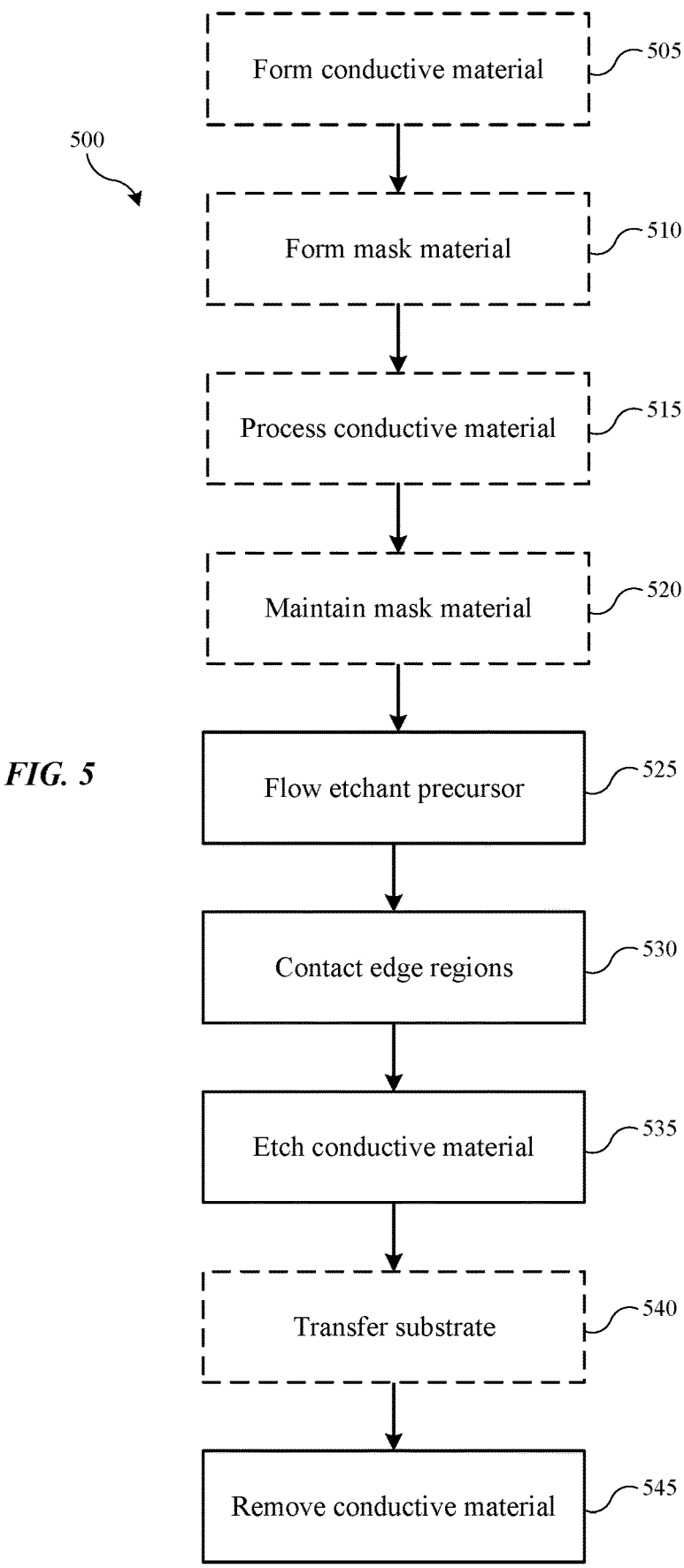
FIG. 5 shows selected operations in an etching method according to some embodiments of the present technology.

FIG. 5 shows an additional example of processing operations that may be performed according to embodiments of the present technology. FIG. 5 illustrates selected operations in a method 500 of producing a semiconductor structure. The figure may show additional aspects of method 300 described above, and may include some or all of the operations described previously. Method 500 may optionally include formation of the layers of material illustrated in FIG. 4, and formed prior to the etching operation of FIG. 3, along with the etching as described previously.

For example, method 500 may include forming a conductive material in optional operation 505. The conductive material may be or include any of the conductive material described previously, and in one non-limiting embodiment may include nickel silicide. The formation or deposition may occur in chamber 200 described previously. Method 500 may also include forming a mask material in optional operation 510. The mask material may be or include any of the previously noted materials, and may in some embodiments include a nitride or oxide material, such as the non-limiting material titanium nitride. Mask material may also be formed or deposited in chamber 200, or any other chamber configurable to produce layers as described above.

In some embodiments, both the conductive material and the mask material may be formed in the same chamber, and may be formed in some embodiments without removing the substrate from the processing chamber during the formation operations.

Method 500 may also include further processing the substrate in optional operation 515, which may produce a specific stoichiometry of the conductive material. For example, a high pressure operation may be performed to adjust the properties of the as-deposited film. The operation may be performed at high pressure, such as greater than or about 5 atm, and may be performed at pressures greater than or about 10 atm, greater than or about 20 atm, greater than or about 50 atm, or higher. In the example of nickel silicide, the processing may produce a 1:1 formation, such as producing nickel monosilicide. In some embodiments a removal operation may be performed to etch back the mask material. However, as explained previously, unlike conventional technology, at least a portion of mask material may be maintained, such as mask material 415 overlying conductive material 410. Such maintenance may ensure that conductive material 410 may not be oxidized by etchant materials, such as Piranha or other oxidizing etchants.

Method 500 may then proceed similarly to method 300 as described previously, and which may be encompassed by method 500. For example, one or more etchant precursors may be delivered at operation 525. The etchant precursors may contact edge regions of the conductive material at operation 530, and may etch the conductive material at operation 535. These operations may include any of the process materials or conditions described above, and may partially etch or remove the conductive material to a first depth. The substrate may be transferred to a separate chamber at optional operation 540 as explained previously, and an additional removal operation, such as a bombardment operation may occur at operation 545. The removal operation may remove a footing or residual material maintained subsequent the previous etch operations as discussed above.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of etching a semiconductor substrate, the method comprising:
flowing a halogen-containing precursor into a processing region of a semiconductor processing chamber, wherein the processing region houses a substrate having a conductive material and an overlying mask material, wherein the conductive material is characterized by a first surface in contact with the mask material, and wherein the mask material defines an edge region of the conductive material;
flowing an oxygen-containing precursor into the processing region of the semiconductor processing chamber;
contacting the edge region of the conductive material with the halogen-containing precursor and the oxygen-containing precursor;
etching in a first etching operation the edge region of the conductive material to a partial depth through the conductive material to produce a footing of conductive material protruding along the edge region of the conductive material; and
removing the footing of conductive material in a second etching operation.

2. The method of etching a semiconductor substrate of claim 1, wherein the second etching operation comprises contacting the footing of conductive material with ions configured to sputter the footing from the conductive material.

3. The method of etching a semiconductor substrate of claim 2, wherein the first etching operation occurs in a first direction through a thickness of the conductive material, and wherein the second etching operation delivers ions in a direction substantially normal to the first direction.

4. The method of etching a semiconductor substrate of claim 2, wherein the second etching operation is performed at an ionic source power below or about 5 kW.

5. The method of etching a semiconductor substrate of claim 1, wherein the semiconductor processing chamber is a first chamber, and wherein the second etching operation is performed in a second chamber different from the first chamber.

6. The method of etching a semiconductor substrate of claim 5, wherein the first chamber and the second chamber are coupled with a single processing system, wherein the method further comprises transferring the substrate from the first chamber to the second chamber.

7. The method of etching a semiconductor substrate of claim 6, wherein the substrate is maintained under vacuum conditions during the transferring from the first chamber to the second chamber.

8. The method of etching a semiconductor substrate of claim 1, wherein the halogen-containing precursor comprises at least one of a chlorine-containing precursor and a fluorine-containing precursor.

9. The method of etching a semiconductor substrate of claim 1, wherein the method is performed at a chamber temperature less than or about 150° C.

10. The method of etching a semiconductor substrate of claim 1, wherein the conductive material comprises one or more elements selected from the group consisting of titanium, platinum, nickel, tantalum, molybdenum, silicon, and ruthenium.

11. The method of etching a semiconductor substrate of claim 10, wherein the conductive material comprises more than 90% by volume nickel monosilicide.

12. A method of etching a semiconductor substrate, the method comprising:
flowing an etchant precursor into a processing region of a semiconductor processing chamber, wherein the processing region houses a substrate having a conductive material and an overlying mask material, wherein the conductive material is characterized by a first surface in contact with the mask material, and wherein the mask material defines an edge region of the conductive material;
contacting the edge region of the conductive material with the etchant precursor;
etching in a first etching operation the edge region of the conductive material to a partial depth, wherein the conductive material is at least partially maintained during the first etching operation; and
sputtering the conductive material that is at least partially maintained in a second etching operation.

13. The method of etching a semiconductor substrate of claim 12, wherein the etchant precursor comprises a halogen-containing precursor and an oxygen-containing precursor.

14. The method of etching a semiconductor substrate of claim 13, wherein at least one of the halogen-containing precursor or the oxygen-containing precursor is plasma enhanced during the first etching operation.

15. The method of etching a semiconductor substrate of claim 13, wherein the halogen-containing precursor comprises a combination of a chlorine-containing precursor and a fluorine-containing precursor.

16. The method of etching a semiconductor substrate of claim 12, wherein the conductive material comprises a silicide of titanium, nickel, platinum, tantalum, tungsten, cobalt, or molybdenum.

17. The method of etching a semiconductor substrate of claim 12, wherein the mask material comprises a transition-metal nitride.

18. The method of etching a semiconductor substrate of claim 12, wherein the first etching operation occurs in a first direction through a thickness of the conductive material, and wherein the second etching operation delivers ions in a direction substantially normal to the first direction.

19. A method of etching a semiconductor substrate, the method comprising:
flowing an etchant precursor into a processing region of a first semiconductor processing chamber, wherein the processing region houses a substrate having a conductive material;

contacting an edge region of the conductive material with the etchant precursor;

etching in a first etching operation the edge region of the conductive material to a partial depth, wherein the conductive material is at least partially maintained during the first etching operation;

transferring the substrate from the first semiconductor processing chamber to a second semiconductor processing chamber while maintaining vacuum conditions; and sputtering the conductive material that is at least partially maintained in a second etching operation in the second semiconductor processing chamber.

20. The method of etching a silicon-containing material of claim 19, wherein the first etching operation occurs in a first direction through a thickness of the conductive material, and wherein the second etching operation delivers ions in a direction substantially normal to the first direction.

* * * * *